(12) United States Patent
Kang

(10) Patent No.: US 6,913,939 B2
Kang
(45) Date of Patent: Jul. 5, 2005

(54) METHOD FOR INSPECTING A WAFER AND APPARATUS FOR INSPECTING A WAFER

(75) Inventor: Hyo-Cheon Kang, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/750,470

(22) Filed: Dec. 31, 2003

(65) Prior Publication Data

US 2004/0161866 A1  Aug. 19, 2004

(30) Foreign Application Priority Data

Jan. 15, 2003  (KR) .................................. 10-2003-0002599

(51) Int. Cl.[7] .............................................. H01L 21/66
(52) U.S. Cl. ........................................ 438/16; 324/751
(58) Field of Search .............................. 324/750–754, 324/765; 356/237, 394; 438/7, 12, 14–18, 963, 972; 257/911

(56) References Cited

U.S. PATENT DOCUMENTS 6,091,249 A  *  7/2000  Talbot et al. ................ 324/751
6,384,909 B2  *  5/2002  Tomita et al. ............. 356/237.1
6,586,952 B2  *  7/2003  Nozoe et al. ................ 324/751

* cited by examiner

Primary Examiner—Matthew Smith
Assistant Examiner—Calvin Lee
(74) Attorney, Agent, or Firm—Marger Johnson & McCollom, P.C.

(57) ABSTRACT

Disclosed are a method and apparatus for inspecting a wafer for electrical defects. A first electron beam is irradiated onto an area of the wafer including an inspection region to charge the area. A second electron beam is irradiated onto the inspection region to inspect the inspection region after focusing the second electron beam on the inspection region. A third electron beam is irradiated onto the area to discharge charges accumulated on the area. Therefore, the electrical defect of the wafer can be precisely detected with increased voltage contrasts for distinguishing the electrical defect. This method and apparatus have improved detection sensitivity and detection reliability over conventional methods.

22 Claims, 4 Drawing Sheets

MOVEMENT DIRECTION OF THE WAFER

FIG. 4B

MOVEMENT DIRECTION OF THE WAFER

FIG. 4C

MOVEMENT DIRECTION OF THE WAFER

FIG. 4D

MOVEMENT DIRECTION OF THE WAFER

METHOD FOR INSPECTING A WAFER AND APPARATUS FOR INSPECTING A WAFER

CROSS REFERENCE TO RELATED APPLICATION

This application claims priority under 35 USC § 119 to Korean Patent Application No. 2003-2599, filed on Jan. 15, 2003, the contents of which are incorporated herein by reference in their entirety.

BACKGROUND OF THE INVENTION

1. Field of the Invention

The present invention relates to a method and an apparatus for inspecting a wafer. More particularly, the present invention relates to a method for inspecting a wafer for electrical defects of a semiconductor device formed on the wafer using electron beams and an apparatus for performing the same.

2. Description of the Related Art

Generally, semiconductor devices are fabricated by performing a series of unit processes to a wafer. When the unit processes for manufacturing the semiconductor devices are performed, defects that cause failures of the semiconductor devices can be generated on a wafer. These defect are generally divided into physical defects, like contaminant particles, and electrical defects, which cause faulty operation or electrical deterioration of the semiconductor devices. For example, electrical defects can include problems such as a contact that is not opened or a contact with an increased resistance.

Wafers are usually analyzed with electron beams to find electrical defects. In a method for analyzing wafers for electrical defects using electron beams, the electron beams are primarily irradiated onto a surface of a predetermined inspection region of a wafer. The surface of the wafer is charged instantly, and secondary electrons are then emitted from the wafer surface. The secondary electrons are detected and electrical defects on the wafer can then be analyzed by contrasting the voltages of the secondary electrons.

U.S. Pat. No. 6,091,249 (issued to Talbot et al.) discloses a method for analyzing a defect of a wafer using electron beams. According to the disclosure in U.S. Pat. No. 6,091,249, the process for analyzing wafers for defects is performed by instantly charging a pre-determined surface of a region of the wafer. However, when the surface of the wafer has been charged insufficiently, a sufficient voltage contrast generated from a defective region may not be obtained. As a result, an electrical defect generated on the surface of the wafer may not be detected.

After the analysis of the first region of the surface of the wafer is finished, another region of the wafer surface is then analyzed. When this second region of the wafer is adjacent to the first analyzed region of the wafer, which is common for ease of analysis, a section of the second region can overlap the first region. Because the first region has already been inspected and now has a charge, the overlapping section in the second region will have different charge characteristics from the rest of the second region. These different conditions can interfere with the detection process in the second region. This in turn can reduce the detection sensitivity and detection reliability of the testing apparatus.

SUMMARY OF THE INVENTION

Therefore, it is a first feature of the present invention to provide a method for analyzing a wafer for electrical defects with improved detection sensitivity and detection reliability.

It is a second feature of the present invention to provide an apparatus for detecting electrical defects in a wafer with improved detection sensitivity and detection reliability.

In accordance with one aspect of the present invention, a first electron beam is irradiated onto an area of the wafer, including an inspection region, to charge the area with first charges. Then, a second electron beam is focused and irradiated onto the inspection region in order to inspect an electrical defect. Next, a third electron beam is irradiated onto the area to discharge the charges that have accumulated on the area.

In accordance with another aspect of the present invention, a first electron beam is irradiated onto a first region of the wafer to charge the first region. A second electron beam is then irradiated onto an inspection region of the wafer adjacent to the first region to inspect the wafer. A third electron beam is next irradiated onto a second region of the wafer adjacent to the inspection region to discharge charges that may have accumulated on the second region. The second region also has a size identical to that of the first region. The wafer is moved from the first electron beam to the third electron beam so that the first, the second and the third electron beams are irradiated onto each region of the wafer in that order.

In accordance with still another aspect of the present invention, an apparatus for detecting electrical defects of a wafer can include a chamber, a stage for loading the wafer, a first column for irradiating a first electron beam onto a first region of the wafer, a second column for irradiating a second electron beam onto an inspection region of the wafer adjacent to the first region, a third column for irradiating a third electron beam onto a second region of the wafer adjacent to the inspection region, a signal processing member for detecting a voltage contrast signal of secondary electrons generated from the wafer, and a defect analyzing member for detecting a defect of the wafer. In this aspect of the invention, the stage is installed in the chamber and moved horizontally. The signal processing member detects the voltage contrast signal by irradiating the second electron beam and the defect analyzing member detects the defect of the wafer by analyzing a signal generated from the signal processing member.

According to the present invention, the possibility of failing to detect an electrical defect of a wafer caused by insufficient charging of the wafer during the detection analysis can be minimized. Additionally, the possibility of not detecting an electrical defect of a wafer from detection sensitivity failures caused by charges being maintained on the wafer can be reduced. As a result, electrical defects on the wafer can be precisely detected.

BRIEF DESCRIPTION OF THE DRAWINGS

The above and other advantages of the present invention will become more apparent by describing in detail embodiments thereof with reference to the accompanying drawings, in which.

DETAILED DESCRIPTION OF THE PREFERRED EMBODIMENTS

Hereinafter, the embodiments of the present invention will be described in detail with reference to the accompanying drawings. In the drawings, like reference numerals identify similar or identical elements.

A first electron beam is irradiated onto an area of a wafer to primarily charge the area of the wafer with first charges. The area of the wafer includes an inspection region. Energy of the first electron beam is controlled such that the polarity of the charges accumulated on the first region by the first electron beam is identical to that of charges accumulated while the wafer is inspected. By primarily charging an adjacent region of the inspection region of the wafer, the voltage contrast used for differentiating and detecting an electrical defect during the inspection process is greatly increased.

A second electron beam is focused and irradiated onto the inspection region of the wafer. The inspection region is secondarily and instantly charged with second charges by the irradiation. Secondary electrons generated from the inspection region are then detected. The electrical defect of the wafer is inspected by voltage contrasts in the detected secondary electrons.

The inspection region is also charged with the first charges by the irradiation from the first electron beam. Since there is a large difference between the secondary electrons generated from an electrically defective region and a normal region, the voltage contrast ratio between the defective region and the normal region are increased, which allows for easier detection of the electrical defect of the wafer. Also, the possibility of not detecting the defective region caused by an insufficient charging of the inspection region is reduced.

A third electron beam is irradiated onto the area of the wafer to discharge the first and the second charges that have been accumulated on the area where the first and the second electron beams have been irradiated. The third electron beam is irradiated to discharge the area by controlling the beam energy thereof so that the third electron beam generates charges with opposite polarity of those from the first and the second electron beams. Therefore, a decrease in the defect detection sensitivity caused by the charges remaining on the wafer surface due to the first and the second electron beams is reduced.

Figure 1:
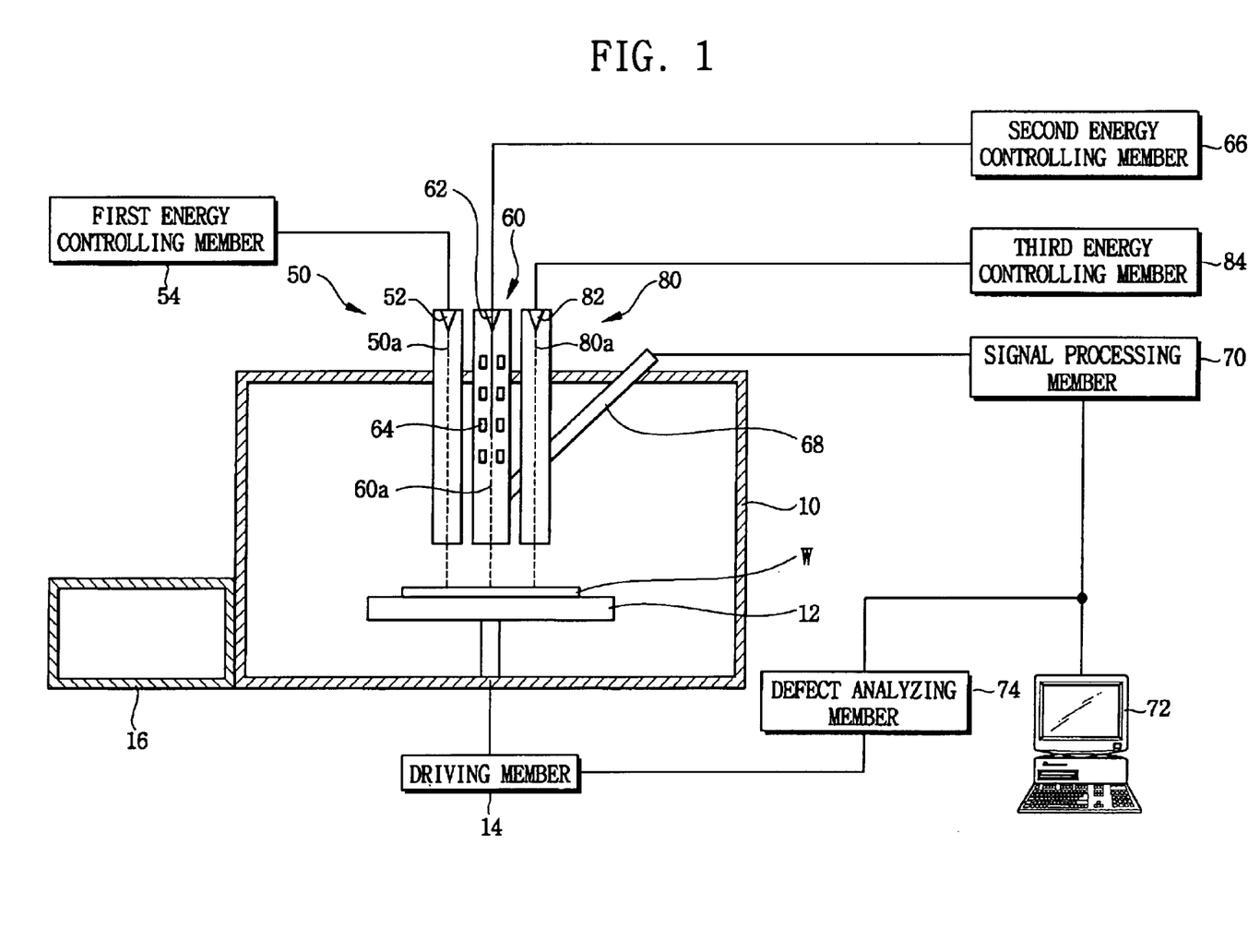
FIG. 1 is a schematic cross-sectional view illustrating an apparatus for inspecting a wafer according to an embodiment of the present invention.

FIG. 1 is a schematic cross-sectional view illustrating a wafer inspection apparatus according to an embodiment of the present invention.

Referring to FIG. 1, the wafer inspection apparatus has a vacuum chamber 10 for receiving and inspecting a wafer W therein.

A stage 12 for loading the wafer W is provided in the vacuum chamber 10. The wafer W loaded on the stage 12 is a wafer on which semiconductor devices are partially formed or completed. The stage 12 for loading the wafer W can move horizontally in an X-axis direction and may also move vertically in a Y-axis direction using a driving member 14 connected to the stage 12. A wafer alignment member can be additionally installed over the stage 12 for detecting and aligning the loaded wafer W. The wafer alignment member can include an optical microscope.

A wafer handling member is additionally provided for moving the wafer W onto the stage 12. The wafer handling member includes a load rock chamber 16 connected to the vacuum chamber 10, and a robot arm (not shown) for moving the wafer W from the load rock chamber 16 to the stage 12. The load rock chamber 16 is provided to sufficiently maintain a vacuum condition of the vacuum chamber 10 while the wafer W is introduced in the vacuum chamber 10 or extracted from the vacuum chamber 10.

A first electron microscope column 50 (hereinafter, referred to as a first column) for irradiating a first electron beam 50a onto a first region of the wafer W loaded in the vacuum chamber 10 is provided. The first column 50 is connected to the vacuum chamber 10 as well. The first column 50 includes a first electron gun 52 for irradiating electrons from a first electron source onto the first region of the wafer W. A first energy controlling member 54 is connected to the first column 50 so as to control the energy of the first electron beam 50a irradiated from the first electron gun 52. A secondary electron yield of the first electron beam 50a can be controlled to be more than 1 or less than 1 using the first energy controlling member 54. The first column 50 can additionally include a lens assembly for focusing the first electron beam 50a on the first region of the wafer W.

A second electron microscope column 60 (hereinafter, referred to as a second column) connected to the vacuum chamber 10 is directed over the wafer W loaded in the vacuum chamber 10. The second column 60 irradiates a second electron beam 60a onto an inspection region of the wafer W in order to inspect an electrical defect of the wafer W loaded into the vacuum chamber 10.

The second column 60 includes a second electron gun 62 for irradiating electrons from a second electron source onto the inspection region of the wafer W. A second energy controlling member 66 is coupled to the second column 60 in order to control the energy of the second electron beam 60a irradiated from the second electron gun 62. A secondary electron yield of the second electron beam 60a can be controlled to be more than 1 or less than 1 using the second energy controlling member 66.

The second column 60 includes a lens assembly 64 for precisely focusing the second electron beam 60a on the inspection region of the wafer W. The inspection region of the wafer W has a size smaller than that of the first region. Lenses of the lens assembly 64 direct the irradiated second electron beam 60a onto the inspection region.

The lenses of the lens assembly 64 are magnetic immersion type lens. The lens fields of these lenses serve as magnetic-bottle shapes. Therefore, an electron beam can be aligned in the inspection region when strong electrostatic fields are not generated by the lens.

A detector 68 is disposed over the wafer W. The detector 68 detects secondary electrons generated from the wafer W after the wafer has been irradiated by the second electron beam 60a onto the inspection region.

A signal processing member 70 is coupled to the detector 68 so as to produce an amplified voltage contrast that is generated from the secondary electrons collected by the detector 68. A display member 72 is provided for displaying the voltage contrast image generated from the signal processing member 70, which is connected to it. The voltage contrast image is displayed as a bright or a dark image in accordance with the collected secondary electrons. Therefore, the electrical detections of the inspection region of the wafer W can be distinguished according to a difference between the produced images.

For example, when the secondary electron yield of the second electron beam 60a is more than 1, a voltage contrast image produced from a region of the wafer W on which a contact is formed is relatively bright. However, a relatively dark image is produced from a region of the wafer W where a contact is not opened. Thus, a normal formation of the contact can be confirmed when the bright image is produced from the region where the contact is positioned.

A defect analyzing member 74 is provided in order to analyze the defect of the wafer W using the produced voltage contrast. The defect analyzing member 74 is connected to the signal processing member 70 and the driving member 14. The defect analyzing member 74 detects the defect of the wafer W using the voltage contrast signal produced from portions of the wafer W. Then, the defect analyzing member 74 records the position data of the defect.

A third electron microscope column 80 (hereinafter, referred to as a third column) is installed over the wafer W. The third column 80 irradiates a third electron beam 80*a* onto a second region of the wafer adjacent to the inspection region. Here, the inspection region of the wafer is linearly interposed in parallel between the first region and the second region. The third column 80 is provided such that the third electron beam 80*a* is irradiated onto the second region having a size identical to that of the first region.

The third column 80 includes a third electron gun 82 for irradiating electrons from a third electron source onto the second region of the wafer W. A third energy controlling member 84 is coupled to control an energy of the third electron beam 80*a* irradiated from the third electron beam 82. A secondary electron yield of the third electron beam 80*a* can be controlled to be more than 1 or less than 1 using the third energy controlling member 84. The third column 80 can additionally include a lens assembly for focusing the third electron beam 80*a* on the second region of the wafer W.

Figure 2:
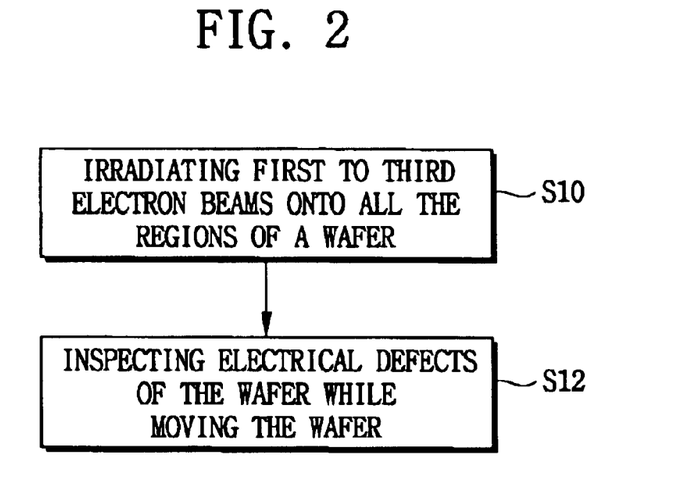
FIG. 2 is a flow chart illustrating a method for inspecting a wafer according to an embodiment of the present invention.

FIG. 2 is a flow chart illustrating a method for inspecting the wafer according to this embodiment of the present invention.

The method for inspecting the wafer can be performed using the apparatus in FIG. 1. The wafer to be inspected includes insulating layers, and contacts formed through the insulating layers. The contacts electrically connect a lower conductive film to an upper conductive film. The method for inspecting the wafer is performed to confirm that the contacts are adequately connected to the lower conductive film.

The method can begin with the first to third electron beams being irradiated onto the wafer W to be inspected (step S10).

Figure 3:
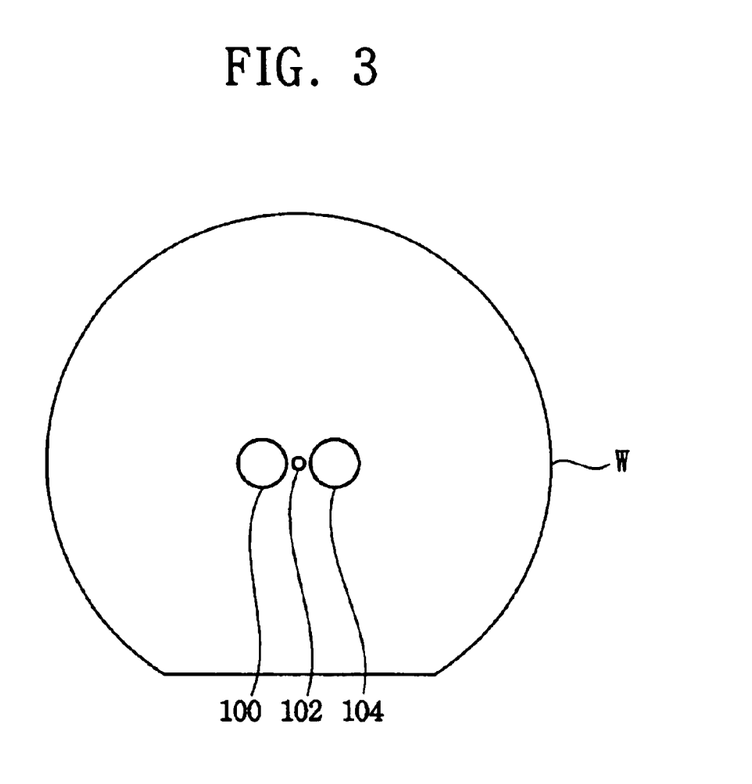
FIG. 3 is a schematic plan view illustrating regions of the wafer where first, second, and third electron beams are irradiated.

FIG. 3 illustrates possible regions of the wafer W to be inspected where the first to the third electron beams are irradiated. It should be noted that the regions in FIG. 3, where the electron beams are irradiated, are enlarged for clarity.

The first electron beam 50*a* is irradiated onto a first region 100 of the wafer W to charge the region. A polarity of charges accumulated on the first region 100 are determined by the secondary electron yield of the first electron beam 50*a* irradiated onto the first region 100. When the secondary electron yield of the first electron beam 50*a* is more than 1, the number of electrons emitted from the wafer W is larger than that of electrons accumulated on the wafer W. Therefore, a surface of the wafer W is positively charged by emission of the electrons. On the contrary, when the secondary electron yield of the first electron beam 50*a* is less than 1, the number of electrons emitted from the wafer W is less than that of electrons accumulated on the wafer W. Thus, the surface of the wafer W is negatively charged. The secondary electron yield of the first electron beam 50*a* can be controlled to be less than 1 or more than 1 by controlling the energy of the first electron beam 50*a*. The first electron beam 50*a* is irradiated by controlling the beam energy such that the voltage contrast can be sufficiently increased when an inspection region 102 of the wafer W is inspected using the second electron beam 60*a*.

Therefore, when the secondary electron yield of the second electron beam 60*a* for inspecting the wafer W is more than 1, the energy of the first electron beam 50*a* can be controlled such that the secondary electron yield of the first electron beam 50*a* is more than 1. In addition, when the secondary electron yield of the second electron beam 60*a* is less than 1, the energy of the second electron beam 60*a* can be controlled such that the secondary electron yield of the first electron beam 50*a* is less than 1. Hereinafter, the secondary electron yield of the first electron beam 50*a* will be considered more than 1 for the following description of the detecting method.

When the first electron beam 50*a* is irradiated such that the secondary electron yield of the first electron beam 50*a* is more than 1, positive charges are accumulated on surfaces of the insulating layers of the wafer W. On the surfaces of contacts of the wafer W, however, the positive charges are not accumulated, because all the positive charge flows into an underlying conductive film positioned under the contacts. However, if the contacts are not opened, the positive charges accumulate on the surface because the not opened contacts do not make contact with the underlying conductive film and the positive charges cannot flow into the underlying conductive film.

The second electron beam 60*a* is irradiated onto the inspection region 102 of the wafer W. The inspection region 102, inspected by the second electron beam 60*a*, preferably has a size smaller than that of the first inspection region 100. This is to make sure that the inspection region 102 may be sufficiently included in the first region 100. The second electron beam 60*a* is irradiated by controlling the secondary yield of the second electron beam 60*a* such that the second electron beam 60*a* causes the same polarity of charges on the surface of the wafer W as the polarity of charges caused by the first electron beam 50*a*.

For example, when the second electron beam 60*a* is irradiated onto the wafer W such that the secondary electron yield of the second electron beam 60*a* is more than 1, the surface of the wafer W is instantly positively charged. When contacts are formed normally on the wafer W, the positive charges flow into the underlying conductive film in the contact regions. Therefore, the net charges of the contact regions become zero. On the contrary, when the contacts of the wafer W are not opened, the charges are accumulated on the surface of the wafer W without flowing into the underlying conductive film.

The third electron beam 80*a* is irradiated to discharge a second region 104 of the wafer W having a size identical to that of the first region 100 and being adjacent to the inspection region 102. The third electron beam 80*a* is irradiated so as to discharge the inspection region 102 after the inspection region 102 is inspected. Therefore, when each of the secondary electron yield of the first electron beam 50*a* and the second electron beam 60*a* is more than 1, the energy of the third electron beam 80*a* is controlled such that the secondary electron yield of the third electron beam 80*a* is less than 1. When each of the secondary electron yield of the first electron beam 50*a* and the second electron beam 60*a* is less than 1, the energy of the third electron beam 80*a* is controlled to have the secondary electron yield of more than 1. The third electron beam 80a is also irradiated by controlling the beam energy such that the surface of the wafer W charged by the first electron beam 50a and the second electron beam 60a is entirely discharged. Here, a center of the region where the third electron beam 80a is irradiated is preferably positioned on a straight line with the centers of the other two regions where the first electron beam 50a and the second electron beam 60a have been irradiated.

While the first, second, and third electron beams are irradiated onto the wafer W, the wafer W is moved. This allows the inspection region of the wafer W to be inspected using the sequentially irradiated first to third electron beams 50a, 60a, and 80a (step S12). The first to the third electron beams 50a, 60a, and 80a are preferably irradiated such that each center of the beams and the surface of the wafer W are positioned on a straight line. It is preferable that the method for inspecting the wafer W is performed on every portion of the wafer W while the wafer W is moved from the first column 50 to the third column 80. When the wafer W is moved as described above, a charging process, an inspecting process, and a discharging process are repeatedly performed continuously in accordance with the sequential irradiations of the first, second, and third electron beams 50a, 60a, and 80a, respectively.

FIGS. 4A to 4D are schematic cross-sectional views illustrating a method for inspecting an unopened contact formed on the wafer W according to the present invention.

Hereinafter, the method for inspecting an unopened contact region and a contact region formed on the wafer W will be described with reference to FIGS. 4A to 4D. Contacts, such as 204a and 204b, which are supposed to be electrically connected to an underlying conductive film 200, are repeatedly formed on the surface of a wafer W to be inspected.

Figure 4A:
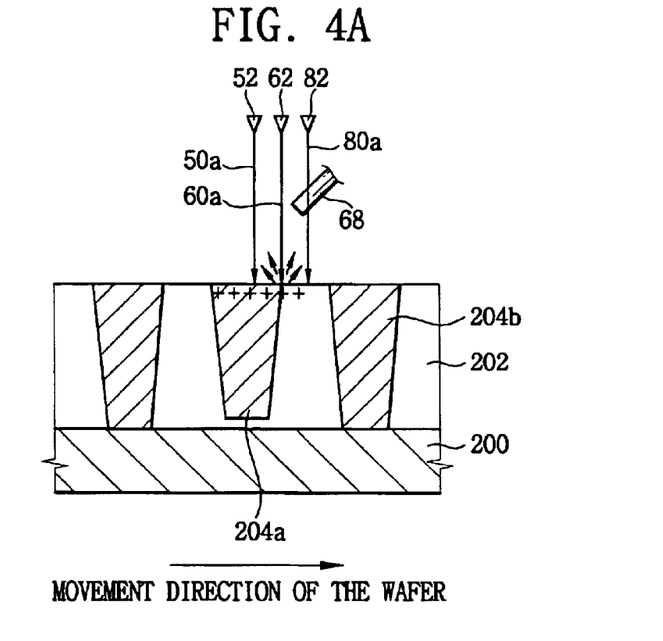
FIGS. 4A–4D are schematic cross-sectional views illustrating a method for inspecting a unopened contact, which is formed on a surface of a wafer according to an embodiment of the present invention.

Referring to FIG. 4A, the first electron beam 50a is irradiated onto the unopened contact region 204a formed on the wafer W. The energy of the first electron beam 50a is controlled such that, for example, the secondary electron yield of the first electron beam 50a is more than 1. When the first electron beam 50a is irradiated onto the unopened contact region 204a, the unopened contact region 204a becomes positively charged. The second electron beam 60a and the third electron beam 80a are then sequentially irradiated onto a region adjacent to the region where the first electron beam 50a is irradiated. The surface of the wafer W is inspected by detecting secondary electrons emitted from the wafer W after the second electron beam 60a is irradiated onto the wafer W. The wafer W is moved from the first column 50 to the third column 80.

Figure 4B:
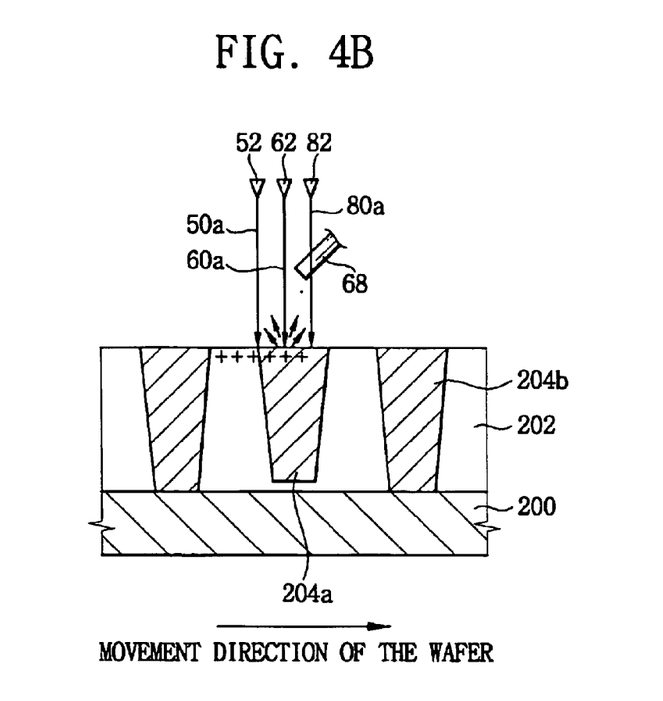

FIG. 4B is a schematic cross-sectional view illustrating a point in the inspection process where the unopened contact region 204a of the wafer W is positively charged.

Referring to FIG. 4B, an upper face of the unopened contact region 204a is positively charged by the irradiation of the first electron beam 50a. The second electron beam 60a is also irradiated onto the positively charged unopened contact region 204a. The unopened contact region 204a is secondarily charged with positive charges by the irradiation of the second electron beam 60a. The third electron beam 80a is irradiated onto the region adjacent to the region where the second electron beam 60a is irradiated.

To inspect for electrical defects on the wafer W, the secondary electrons emitted from the wafer W are detected after the second electron beam 60a is irradiated onto the wafer W. The secondary electrons detected by the detector 68, which are generated by the unopened contact region 204a, are much less than on a normal contact region 204b, because the positive charges accumulated on the surface of the wafer W generate an attractive force that captures the secondary electrons.

A voltage contrast is produced from the secondary electrons emitted from the surface of the unopened contact region 204a. Next, an image, which can be brighter or darker than the voltage contrast, is produced. Here, the secondary electrons emitted from the surface of the unopened contact region 204a are detected to be a relatively small quantity and therefore result in an image darker than that of the normal contact region 204b. Therefore, the electrical defects of the wafer W can be inspected by comparing images from the unopened contact region 204a and the normal contact region 204b. To precisely detect a defect of the wafer W, a difference in the voltage contrast of an unopened contact region 204a and a normal contact forming region 204b should be relatively large.

Meanwhile, the unopened contact region 204a is charged with more positive charges in comparison to a conventional method, because the unopened contact region 204a is charged by a first electron beam 50a before being inspected by a second electron beam 60a. This greater positive charge accumulated on the unopened contact region 204a captures more secondary electrons. Hence, a difference in numbers of the secondary electrons generated from the normal contact region 204b and the unopened contact region 204a becomes relatively large. Also, a difference in brightness between the images of the unopened contact region 204a and the normal contact region 204b becomes larger than that of the conventional method. A process that only analyzes the wafer W for defects using the positive charges instantly accumulated on the wafer W, has an increased risk of inspection failure caused by insufficient charging on the surface.

Figure 4C:
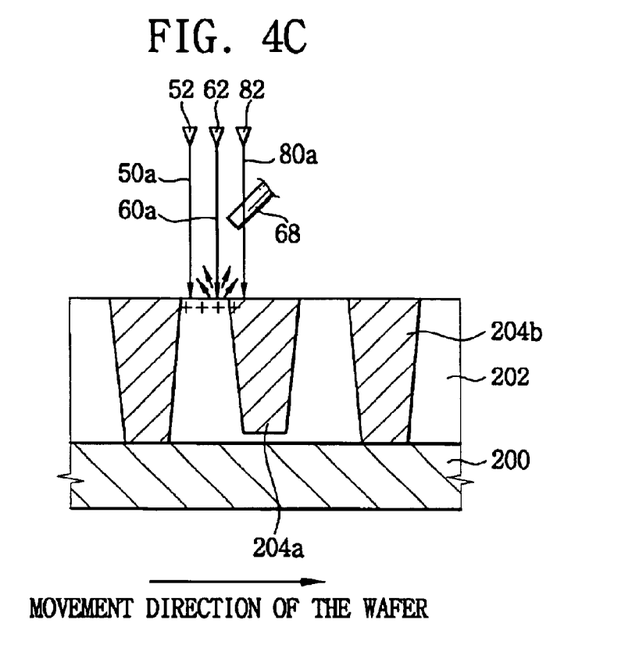

FIG. 4C is a schematic cross-sectional view illustrating a point in the inspection process where the unopened contact region 204a of the wafer W is inspected.

Referring to FIG. 4C, the first electron beam 50a is irradiated onto the upper face of the unopened contact region 204a. The second electron beam 60a is irradiated onto the region charged by the first electron beam 50a as described in FIG. 4B. The electrical defects of the wafer W are inspected using the secondary electrons emitted from the wafer W after the second electron beam 60a is irradiated onto the surface of the wafer W.

Figure 4D:
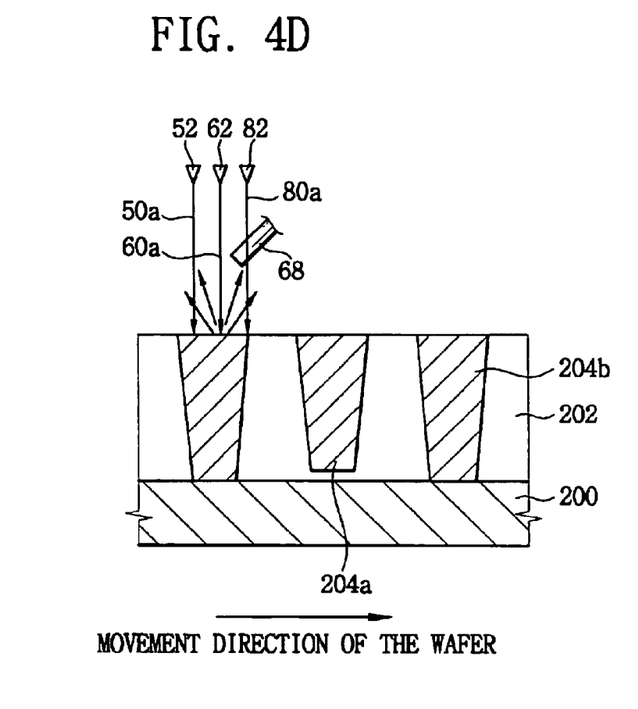

The third electron beam 80a is irradiated onto the unopened contact region 204a, which has been previously inspected, to discharge the positively charged surface of the wafer W. Thus, the third electron beam 80a is irradiated by controlling the beam energy so that the secondary electron yield of the third electron beam 80a is less than 1. Because the third electron beam 80a is irradiated, the positive charges accumulated on the inspection region do not remain after the inspection is completed. Therefore, a decrease of detection sensitivity caused by the positive charges that remain on the surface of the wafer W can be reduced. FIG. 4D is a schematic cross-sectional view illustrating a point in the inspection process where the normal contact region 204b of the wafer W is inspected.

Referring to FIG. 4D, the first electron beam 50a is irradiated onto the upper face of the normal contact region 204b. Then, the second electron beam 60a is irradiated onto the normal contact region 204b. Positive charges do not accumulate on the surface of the normal contact region 204b by the second electron beam 60a, but instead flow into the underlying conductive film 200 connected to the normal contact region 204b. Accordingly, a net charge of the normal contact region 204b becomes zero. Because an attractive force is not generated on the secondary electrons by the second electron beam 60a in the normal contact region 204b, more secondary electrons are detected by the detector 68 compared to a case where the electron beam is irradiated onto the surface of an unopened contact region 204a or an insulating layer 202. Thus, an image brighter than that of the unopened contact region 204a or the insulating layer 202 is produced in the normal contact region 204b. The third electron beam 80a is again irradiated onto the region inspected previously for discharging the positively charged surface of the wafer W.

The above-described method is performed in order to inspect the unopened contact region 204a and the normal contact region 204b among inspection regions in each portion of the wafer W. Because the method for inspecting the wafer W is performed while the wafer W is moved, the method is continuously performed concerning every inspection region positioned in every portion of the wafer W.

The energy of the first and the second electron beams 50a and 60a can be controlled such that each of the secondary electron yields is less than 1. Additionally, the energy of the third electron beam 80a can be controlled such that the secondary electron yield is more than 1. When the first, second, and third electron beams 50a, 60a and 80a are irradiated as described above, the surface of the wafer W is negatively charged. Images of the surface of the insulating layer 202 or the unopened contact region 204a will be brighter than those of the normal contact region 204b.

According to the present invention, the possibility of not detecting the electrical defect of the wafer caused by an insufficient charging of the wafer can be minimized. Additionally, failures resulting from lowered defect detection sensitivity caused by charges maintained on the wafer after the wafer is inspected can be reduced. As a result, an electrical defect of the wafer can be precisely detected.

Having described and illustrated the principles of the invention in embodiments thereof, it should be apparent that the invention can be modified in arrangement and detail without departing from such principles. We therefore claim all modifications and variations coming within the spirit and scope of the following claims.

What is claimed is:

1. A method for inspecting a wafer comprising:
    irradiating a first electron beam onto an area of the wafer including an inspection region to charge the area with first charges;
    irradiating a second electron beam onto the inspection region after focusing the second electron beam on the inspection region to inspect the inspection region; and
    irradiating a third electron beam onto the area to discharge charges accumulated on the area.

2. The method of claim 1, wherein the inspection further comprises:
    irradiating the second electron beam onto the inspection region to charge the inspection region with second charges having a polarity identical to that of the first charges; and
    locating a defect of the inspection region by detecting a voltage contrast of secondary electrons emitted from the inspection region where the second electron beam is irradiated.

3. The method of claim 2, wherein the defect is detected using an image generated from the voltage contrast.

4. The method of claim 1, wherein the first electron beam is controlled so that the voltage contrast is sufficiently increased while the inspection region is irradiated by the second electron beam.

5. The method of claim 1, wherein the third electron beam is irradiated by controlling a beam energy so that the area charged by the first and second electron beams is completely discharged.

6. The method of claim 1, wherein the first electron beam is irradiated to have a secondary electron yield of less than 1, and the third electron beam is irradiated to have a secondary electron yield of more than 1.

7. The method of claim 1, wherein the first electron beam is irradiated to have a secondary electron yield of more than 1, and the third electron beam is irradiated to have a secondary electron yield of less than 1.

8. The method of claim 1, wherein primarily charging the area, inspecting the inspection region, and discharging the area are performed repeatedly by varying inspection regions of the wafer.

9. The method of claim 1, wherein insulating layers are formed on the wafer and conductive pads are formed between the insulating layers.

10. A method for inspecting a wafer comprising:
    irradiating a first electron beam onto a first region of the wafer in order to primarily charge the first region;
    irradiating a second electron beam onto an inspection region of the wafer adjacent to the first region to inspect the inspection region;
    irradiating a third electron beam onto a second region of the wafer adjacent to the inspection region in order to discharge charges accumulated on the second region wherein the second region has a size identical to that of the first region and is aligned with the inspection region and the first region; and
    moving the wafer from the first electron beam to the third electron beam so that the first, the second and the third electron beams are irradiated onto each region of the wafer in order.

11. The method of claim 10, wherein inspecting the inspection region further comprises:
    irradiating the second electron beam onto the inspection region to charge the inspection region with charges having a polarity identical to that of charges accumulated on the first region; and
    locating a defect of the inspection region by detecting a voltage contrast of secondary electrons emitted from the inspection region where the second electron beam is irradiated.

12. The method of claim 11, wherein the defect is decided using an image generated from the voltage contrast.

13. The method of claim 10, wherein the first electron beam is controlled so that the voltage contrast is sufficiently increased while the inspection region is inspected by the second electron beam.

14. The method of claim 10, wherein the third electron beam is controlled so that the first region charged by the first and second electron beams is completely discharged.

15. The method of claim 10, wherein the first electron beam is irradiated to have a secondary electron yield of the first electron beam less than 1, and the third electron beam is irradiated to have a secondary electron yield of the third electron beam more than 1.

16. The method of claim 10, wherein the first electron beam is irradiated to have a secondary electron yield of the first electron beam more than 1, and the third electron beam is irradiated to have a secondary electron yield of the third electron beam less than 1.

17. The method of claim 10, wherein insulating layers are formed on the wafer, and conductive pads are formed between the insulating layers.

18. The method of claim 10, wherein the second region is in parallel with the inspection region and the first region.

19. A method for inspecting a wafer for electrical defects utilizing a first electron beam, a second electron beam and a third electron beam, the method comprising:

utilizing the first electron beam to irradiate an area of the wafer including an inspection region to charge the area;

moving the wafer so that the second electron beam irradiates the inspection region to inspect the inspection region;

detecting electrical defects in the wafer by detecting voltage contrasts generated by the second electron beam; and moving the wafer so that the third electron beam irradiates the area to discharge charges accumulated on the area.

20. The method recited in claim 19, wherein the electron beams are aligned along a straight line, and moving the wafer along the line, sequentially irradiates an area with the first, the second and the third electron beams.

21. The method recited in claim 19, wherein the second electron beam charges the inspection region with charges having a polarity identical to the charges created by the first electron beam.

22. The method of claim 19, wherein the first electron beam has a secondary electron yield less than 1, and the third electron beam has a secondary electron yield more than 1.

* * * * *